(12) United States Patent
Kondo et al.

(10) Patent No.: US 9,881,693 B2
(45) Date of Patent: Jan. 30, 2018

(54) SELECTORS ON INTERFACE DIE FOR MEMORY DEVICE

(71) Applicant: Micron Technology, Inc., Boise, ID (US)

(72) Inventors: Chikara Kondo, Hachioji (JP); Tomoyuki Shibata, Kokubunji (JP); Ryota Suzuki, Zama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/045,061

(22) Filed: Feb. 16, 2016

(65) Prior Publication Data

US 2017/0236597 A1    Aug. 17, 2017

(51) Int. Cl.

| G11C 29/00 | (2006.01) |
|---|---|
| G11C 29/12 | (2006.01) |
| G11C 29/44 | (2006.01) |
| G11C 29/56 | (2006.01) |

(52) U.S. Cl.
CPC ...... *G11C 29/1201* (2013.01); *G11C 29/4401* (2013.01); *G11C 2029/5602* (2013.01)

(58) Field of Classification Search
None
See application file for complete search history.

(56) References Cited

U.S. PATENT DOCUMENTS

| 6,907,555 | B1 | 6/2005 | Nomura et al. | |
|---|---|---|---|---|
| 7,057,948 | B2 | 6/2006 | Shimizu et al. | |
| 7,400,134 | B2 | 7/2008 | Morishita et al. | |
| 7,966,529 | B2 | 6/2011 | Bakhshi et al. | |
| 2002/0174382 | A1* | 11/2002 | Ledford | G06F 13/1694 714/30 |
| 2005/0157565 | A1* | 7/2005 | Lee | G11C 29/26 365/189.05 |
| 2007/0245200 | A1* | 10/2007 | Hattori | G11C 29/028 714/742 |
| 2009/0063913 | A1 | 3/2009 | Yamasaki et al. | |

(Continued)

OTHER PUBLICATIONS

High-Bandwidth Memory (HBM), Obtained from https://www.amd.com/Documents/High-Bandwidth-Memory-HBM.pdf on Feb. 16, 2016.

(Continued)

*Primary Examiner* — Uyen B Tran
(74) *Attorney, Agent, or Firm* — Dorsey & Whitney LLP

(57) ABSTRACT

Apparatuses including an interface chip that interfaces with dice through memory channels are described. An example apparatus includes: an interface chip that interfaces with a plurality of dice through a plurality of memory channels, each of the dice comprising a plurality of memory cells, and the interface chip comprising a test circuit. The test circuit includes: first and second terminals corresponding to the first and second memory channels respectively; a test terminal and a built in self test (BIST) circuit common to the first and second memory channels; and a selector coupled to the first and second terminals, the test terminal and the BIST circuit, and couples a first selected one of the first terminal, the test terminal and the BIST circuit to the first channel and a second selected one of the second terminal, the test terminal and the BIST circuit to the second channel.

6 Claims, 10 Drawing Sheets

(56) References Cited

U.S. PATENT DOCUMENTS

| | | |
|---|---|---|
| 2015/0213860 A1 | 7/2015 | Narui et al. |
| 2016/0011260 A1* | 1/2016 | Dervisoglu ........ G01R 31/3177 714/727 |
| 2017/0053711 A1 | 2/2017 | Shibata et al. |

OTHER PUBLICATIONS

JEDEC Standard: High Bandwidth Memory (HBM) DRAM, JESD235; JEDEC Solid State Technology Association; Published Oct. 2013.
O'Connor, "Highlights of the High-Bandwidth Memory (HBM) Standard", NVIDIA; The Memory Forum; Jul. 14, 2014.
Tran, et al., "HBM: Memory Solution for High Performance Processors", SK Hynix Inc., Oct. 2014.
International Search Report and Written Opinion for PCT App # PCT/US2017/017892, dated May 24, 2017.

* cited by examiner

US 9,881,693 B2

SELECTORS ON INTERFACE DIE FOR MEMORY DEVICE

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking dice vertically and interconnecting the dice using through-silicon vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM).

For example, High Bandwidth Memory (HBM) is a type of memory including a high-performance random access memory (DRAM) interface and vertically stacked DRAM. A typical HBM stack of four DRAM dice has two 128-bit channels per die for a total of eight input/output channels and a width of 1024 bits in total. An interface (I/F) die of the HBM provides an interface with the eight input/output channels, which function independently of each other. For example, a clock frequency, a command sequence, and data can be independently provided for each channel. Thus, the eight input/output channels are not necessarily synchronous to each other.

There are several types of tests which may be performed for HBM. For example, a test pad may be included on the I/F die in order to perform a probe test. In the probe set, input/output lines of a channel may be tested. A number of channels to be tested at a time in the probe test are limited to one under various constraints, such as a size of the test pad and issues in an internal circuit and its wirings. The various constraints also include factors regarding a tester and a probe card for controlling the test pad from outside of the I/F die. Another type of test can be performed using a memory Built-In Self Test (mBIST) circuit that may be provided on the I/F die. The mBIST circuit is provided for verifying failures resulting from stacking the die. A specification of the HBM provides a definition of operations for the mBIST circuit. The mBIST circuit may include an algorithmic pattern generator (APG) and a comparator. Using the mBIST circuit, input/output lines of one channel may be tested. The number of channels tested at a time may be limited to one because the APG occupies a relatively large area on the I/F die with a limited footprint, and including multiple APGs on the I/F die is impractical.

The HBM includes a plurality of data buses and their respective channels that can operate individually. Interference between the respective channels, which may be caused by noises or the like when the respective channels individually operate, may be an issue. FIG. 1 is a wiring diagram of native input/output lines (IOs) between an interface (I/F) die and a core die of the HBM in a semiconductor device. As shown in FIG. 1, noise on one channel (e.g., Core 1 channel) may affect operations of other channels (e.g., Core 0 channel, Core 2 channel, etc.). Thus, testing the plurality of channels individually operating may be desirable in order to address the interference between the respective channels. However, as described above, a number of channels tested by the probe test with the test pad or tested with the mBIST circuit have typically been limited to one.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
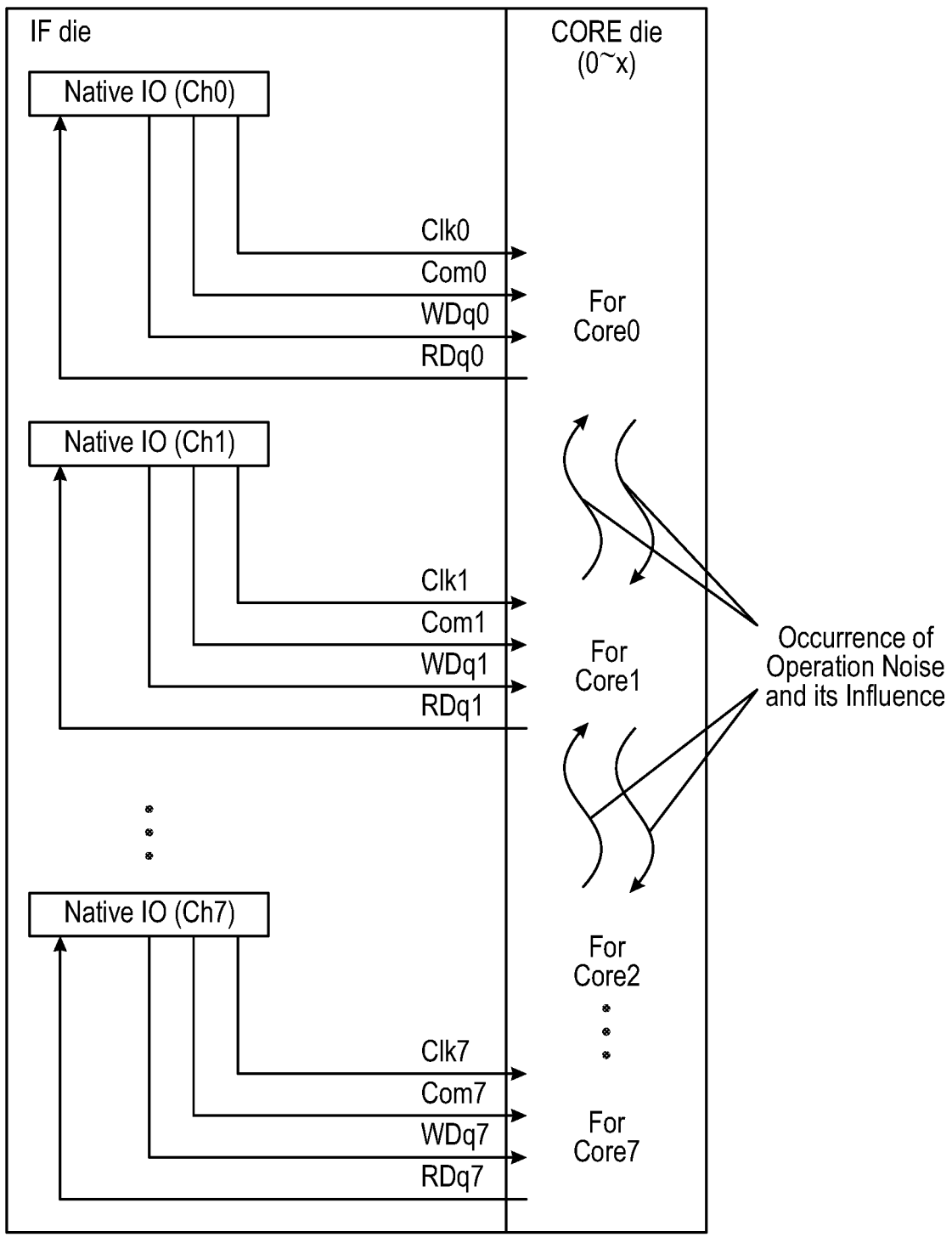
FIG. 1 is a wiring diagram of native input/output lines (IOs) between an interface (I/F) die and a core die of HBM in a semiconductor device.
Figure 2:
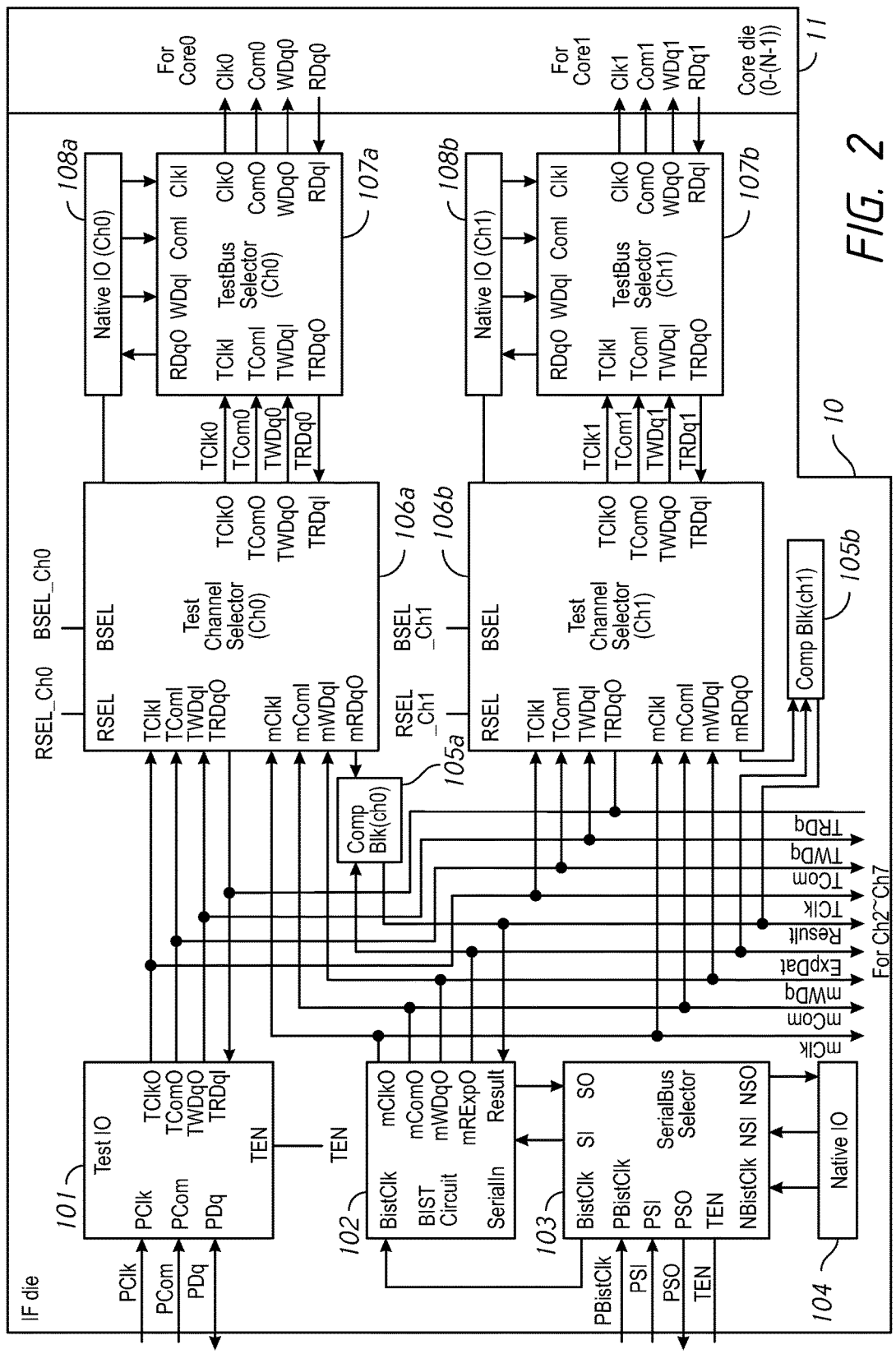
FIG. 2 is a block diagram of an interface (I/F) die including a test input/output (IO) circuit for a probe test and a Built-In Self Test (BIST) circuit in a semiconductor device in accordance with an embodiment of the present disclosure.

FIG. 2 is a block diagram of an interface (I/F) die including a test input/output (IO) circuit for a probe test and a Built-In Self Test (BIST) circuit in a semiconductor device in accordance with an embodiment of the present disclosure. The semiconductor device may include the I/F die 10 and a plurality of core dice (0–(n–1)) 11 where n is a natural number representing a number of the plurality of core dice. FIG. 2 shows an example of communication between Core0 and Core1 of the core dice 11 and corresponding test circuitries of channels Ch0 and Ch1 on the I/F die 10. The I/F die 10 may also include test circuitries of other channels, such as Ch2 to Ch(n−1) and the core die 11 may also include Core2 to Core(n−1).

TABLE 1

Figure 3:
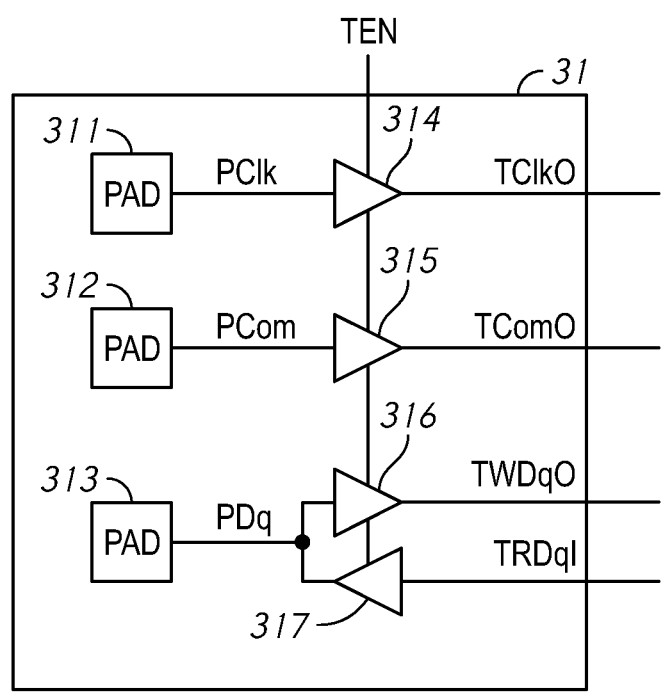
FIG. 3 is a schematic diagram of a test IO circuit for a probe test in accordance with an embodiment of the present disclosure.

A logic table of input/output signals
of the test IO circuit 31 of FIG. 3

|  | TEN = 0 | TEN = 1 |
|---|---|---|
| TClkO | 0 | PClk |
| TComO | 0 | PCom |
| TWDqO | 0 | PWDq |
| PDq (Out) | Hi-z | TRDqI (When read) |

The I/F die 10 includes a test terminal (e.g., a test input/output (IO) circuit, test pad) 101. To perform a probe test, an external tester having a probe may be coupled to the I/F die through the test terminal 101. In a probe test, the test terminal receives a signal from the tester (not shown). FIG. 3 is a schematic diagram of a test IO circuit 31 for the probe test in accordance with an embodiment of the present disclosure. Table 1 is a logic table of input/output signals of the test IO circuit 31 of FIG. 3. The test IO circuit 31 may be used as the test terminal 101 in FIG. 2.

The test IO circuit 31 may receive a test enable signal TEN. The test enable signal TEN may be provided by the tester or may be generated on the I/F die 10. The test IO circuit 31 receives a probe clock signal PClk, and a probe command signal PCom from the probe and provided to respective pads 311 and 312. The probe clock signal PClk and the probe command signal PCom are forwarded to respective buffers 314 and 315. The buffers 314 and 315 also receive the test enable signal TEN and provide signals responsive to the test enable signal TEN. The test terminal 101 may provide data when the test enable signal TEN is at a predetermined logic level (e.g., logic high). For example, the buffers 314 and 315 provides the probe clock signal PClk and the probe command signal PCom as a test clock signal TClkO and a test command signal TComO respectively, when the test enable signal TEN is set to logic high. On the other hand, the buffers 314 and 315 provide a predetermined signal (e.g., logic low), as the test clock signal TClkO and the test command signal TComO respectively, when the test enable signal TEN is set to logic low, regardless of the logic levels of the probe clock signal PClk and the probe command signal PCom. The test IO circuit 31 may receive the probe data queue signal PDq and transmits to a buffer 316 via an input/output pad 313. The pad 313 and the probe communicate to each other using a bi-directional probe data queue signal PDq. When the pad 313 receives the probe data queue signal PDq from the probe, the probe data queue signal PDq represents a probe write data queue signal PWDq. The probe write data queue signal PWDq signal is provided to the buffer 316, which provides a test write data queue signal TWDqO when the test enable signal TEN is set to logic high. Alternatively, the buffer 316 may provide logic low when the test enable signal TEN is set to logic low. When a read command is provided and a data read operation from one of memory cells is executed, a buffer 317 receives a test read queue signal TRDqI from a corresponding test channel selector (e.g., test channel selectors 106a and 106b shown in FIG. 2) and provides the TRDqI as the probe data queue signal PDq via the pad 313 when the test enable signal TEN is set to logic high. In this case, an address signal may be provided on a channel specified by an RSEL signal which is provided to the corresponding test channel selector. If the test enable signal TEN is logic low, then the buffer 317 may set the probe data queue signal PDq to a floating state (Hi-z). Thus, signals from the test terminal 101 may be transmitted to channels within the I/F die 10.

Figure 4:
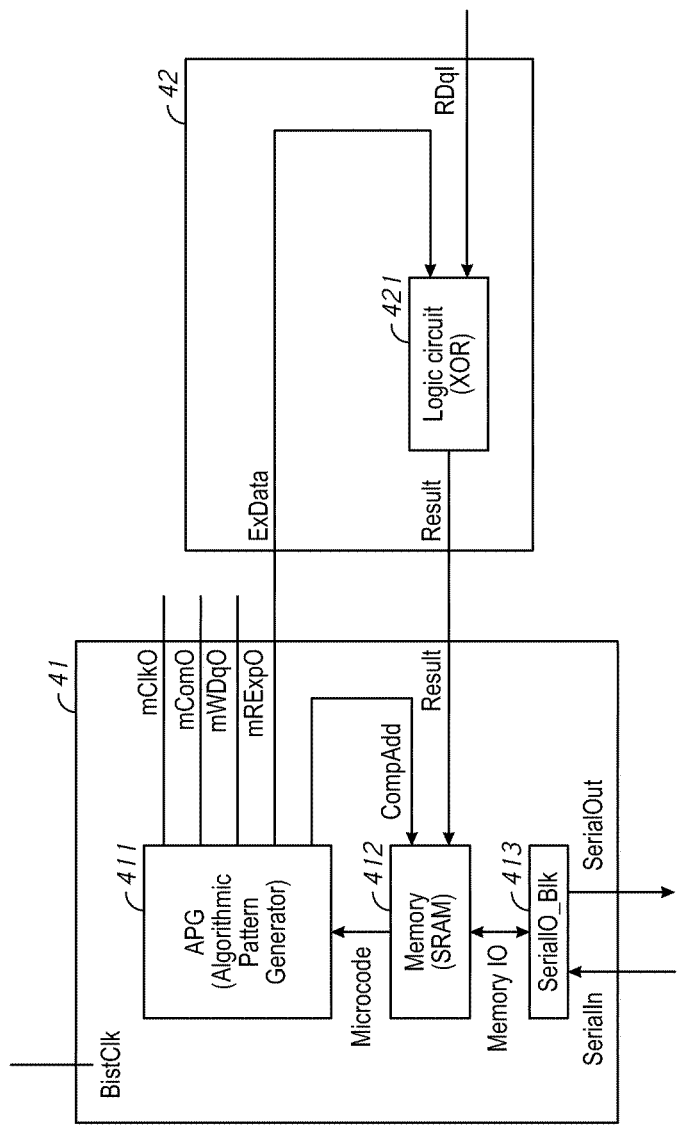
FIG. 4 is a block diagram of a BIST circuit and a comparator in accordance with an embodiment of the present disclosure.

The I/F die 10 of FIG. 2 also includes a built in self test (BIST) circuit 102 and comparator blocks including a comparator block (Comp Blk) for ch0 105a and a comparator block (Comp Blk) for ch1 105b. FIG. 4 is a block diagram of a BIST circuit 41 and a comparator 42 in accordance with an embodiment of the present disclosure. The BIST circuit 41 may be used as the BIST circuit 102 in FIG. 2, and the comparator 42 may be used as one of the comparator blocks (e.g., a comparator block (Comp Blk) for ch0 105a and a comparator block (Comp Blk) for ch1 105b) in FIG. 2. The BIST circuit 41 may include an algorithmic pattern generator (APG) 411, a memory device 412 that may store a microcode, and a serial IO block 413. In some embodiments, the memory device 412 may be a static random access memory (SRAM) device. The BIST circuit 41 receives a Built-In self test clock BistClk. The Built-In self test clock BistClk operates the BIST circuit 41 which generates an mBIST clock signal mClkO. The algorithmic pattern generator (APG) 411 provides an mBIST clock signal mClkO, an mBIST command signal mComO, an mBIST write data queue signal mWDqO and an mBIST expected read data value signal mRExpO, according to data (e.g., Microcode) in the memory device 412. The memory device 412 may also store a comparison result (Result) from the comparator 42. The comparator 42 may include a logic circuit 421, which may be an XOR circuit. The logic circuit 421 may provide the comparison result based on an ExData that is the mBIST expected read data value signal mRExpO from the BIST circuit 41, and a read data queue signal RDqI from a test channel selector 106a, a test channel selector 106b or the like, depending on a selected channel that will be described later.

TABLE 2

A logic table of input/output signals of the comparator of FIG. 4

|  | ExData = RDqI | ExData! = RDqI |
|---|---|---|
| Result | 0 | 1 |

Table 2 is a logic table of input/output signals of the comparator of FIG. 4. For example, when the ExData and the RDqI are at the same logic level, a Result signal may be set to logic low. On the other hand, when the ExData and the RDqI are not at the same logic level, the Result signal may be set to logic high. The logic levels may be vice versa, depending on a definition of logic levels to the signals. A serial IO block 413 handles storing data in the memory device 412 by serial data access via a port SerialIn, and further handles reading data from the memory device 412 by serial data access via a port SerialOut. A command to operate the algorithm pattern generator (APG) 411 may be provided via the port SerialIn.

Test result data may be provided to the BIST circuit 102 in FIG. 2 through a terminal (e.g., a native IO 104 in FIG. 2) or the test terminal via a probe. A serial bus selector 103 included in the I/F die 10 of FIG. 2 provides bus selection information, such as whether the terminal or the probe is selected for testing with the BIST circuit 102. The serial bus selector 103 also receives the test enable signal TEN. If the test enable signal TEN is set to logic low, the terminal may be selected. If the test enable signal TEN is set to logic high, either the terminal or the probe, whichever active, may be selected. The serial bus selector 103 receives a probe Built-In self test clock signal PBistClk from the probe and a native Built-In self test clock signal NBistClk from the terminal, and provides the Built-In self test clock signal BistClk to the BIST circuit (e.g., BIST circuit 102). The serial bus selector 103 also receives a probe SerialIn signal PSI from the probe and a native SerialIn signal NSI from the terminal, and provides the SerialIn signal SI to the BIST circuit (e.g., BIST circuit 102). The serial bus selector 103 also receives the SerialOut signal SO from the BIST circuit and provides a probe SerialOut signal PSO to the probe and a native SerialOut signal NSO to the terminal.

Figure 5:
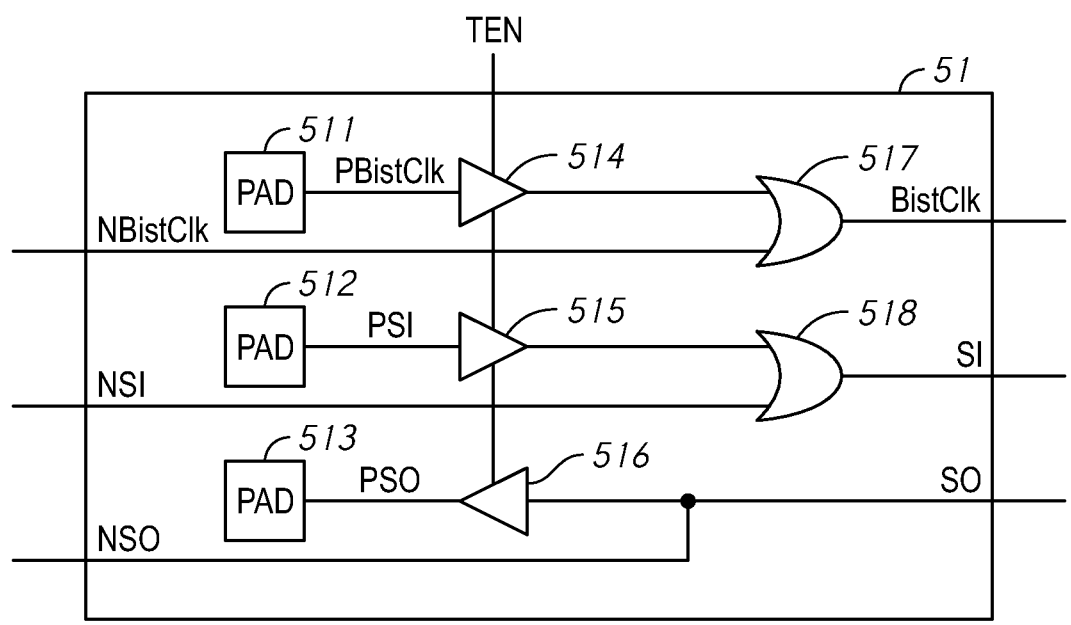
FIG. 5 is a schematic diagram of a serial bus selector in accordance with an embodiment of the present disclosure.

FIG. 5 is a schematic diagram of a serial bus selector 51 in accordance with an embodiment of the present disclosure. Table 3 is a logic table of input/output signals of the serial bus selector 51 of FIG. 5. The serial bus selector 51 may be used as a serial bus selector 103 in FIG. 2. The probe Built-In self test clock signal PBistClk and the probe SerialIn signal PSI from the probe are provided to respective pads 511 and 512. The probe Built-In self test clock signal PBistClk and the probe SerialIn signal PSI are forwarded to respective buffers 514 and 515. The buffers 514 and 515 also receive the test enable signal TEN and provide intermediate signals to respective logic gates 517 and 518 responsive to the test enable signal TEN. The logic gates 517 and 518 also receive their respective complementary signals, the native Built-In self test clock signal NBistClk and the native SerialIn signal NSI from the terminal. When the test enable signal TEN is at a predetermined logic level (e.g., logic high), the buffer 514 provides the probe Built-In self test clock signal PBistClk. The Built-In self test clock signal is provided as a result of the logic gate 517 upon receiving the probe Built-In self test clock signal PBistClk and the native Built-In self test clock signal NBistClk. If the test enable signal TEN is at another predetermined logic level (e.g., logic low), the buffer 514 provides an intermediate signal set to logic low and thus the logic gate 517 provides the native Built-In self test clock signal NBistClk as the Built-In self test clock signal.

TABLE 3

A logic table of input/output signals
of the serial bus selector 51 of FIG. 5

|  | TEN = 0 | TEN = 1 |
| --- | --- | --- |
| BistClk | NBistClk | NBistClk | PBistClk |
| SI | NBistClk | NSI | PSI |
| PSO | Hi-Z | SO |
| NSO | SO | SO |

Similarly, when the test enable signal TEN is set to logic high, the buffer 515 provides the probe SerialIn signal PSI. The SerialIn signal SI is provided as a result of the logic gate 518 upon receiving the probe SerialIn signal PSI and the native SerialIn signal NSI. If the test enable signal TEN is set to logic low, the buffer 515 provides an intermediate signal set to logic low and thus the logic gate 518 provides the native SerialIn signal NSI as the SerialIn signal SI. The serial bus selector 51 also receives the SerialOut signal SO.

The SerialOut signal SO is provided as a native SerialOut signal NSO as well as an input signal to a buffer 516. If the test enable signal TEN is at the logic low level, then the buffer 516 may provide the probe SerialOut signal PSO at a floating state (Hi-z) via a pad 513. Alternatively, the buffer 516 provides the SerialOut signal SO as the probe SerialOut signal PSO via the pad 513 when the test enable signal TEN is at the logic high level.

The I/F die 10 includes a plurality of test channel selectors 106a, 106b, . . . and the like. One test channel selector is provided for each channel. Each test channel selector (e.g., 106a, 106b) are coupled to the test terminal 101, the BIST circuit 102, and test bus selector (e.g., 107a, 107b), and couples a first one of the first terminal (e.g., native IO 108a), the test terminal 101, and the BIST circuit 102 selected to a first channel and a second selected one of the second terminal (e.g., native IO 108b), the test terminal and the BIST circuit 102 selected to a second channel. Here the first one selected is different from the second one selected. Any of the BIST circuit 102 and the test terminal 101 which is coupled to the first test channel selector 106a is decoupled from the second test channel selector 106b. Any of the BIST circuit 102 and the test terminal 101 coupled to the second test channel selector 106b is decoupled from the first test channel selector 106a. For example, each test channel selector receives one signal set of a clock signal, a command signal and a write data queue signal from the test terminal 101 and another signal set of a clock signal, a command signal and a write data queue signal from the BIST circuit 102. Depending on test control signals, each test channel selector further provides one of the received signal sets to a respective test bus selector. Each test channel selector further provides a read data queue signal from the respective test bus selector to the test terminal 101 and the BIST circuit 102.

Figure 6:
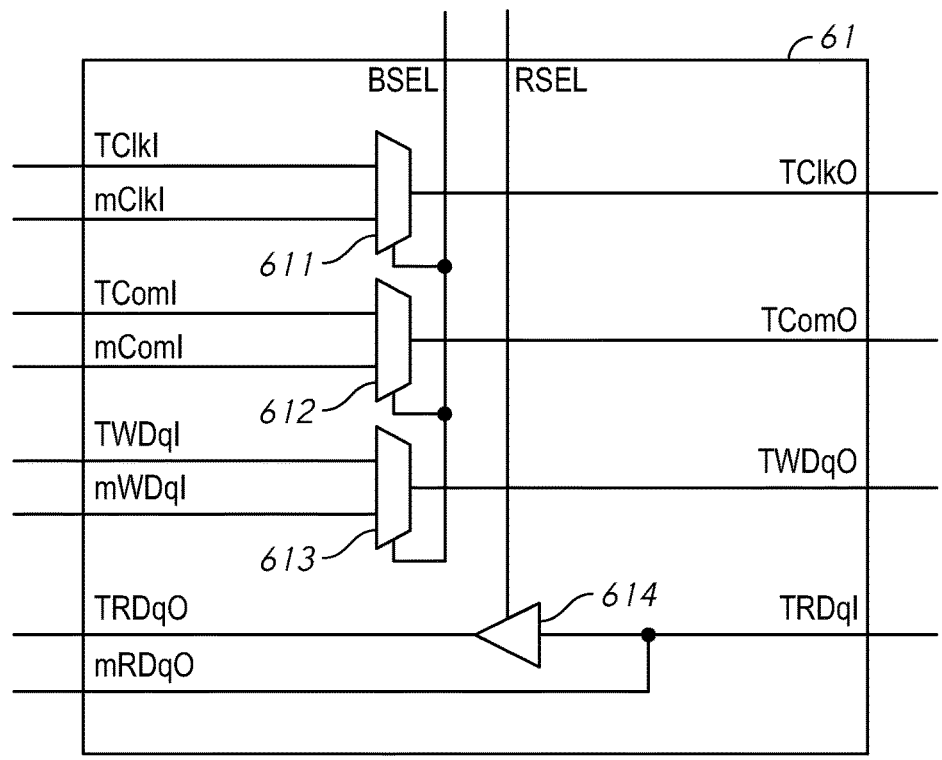
FIG. 6 is a schematic diagram of a test channel selector in accordance with an embodiment of the present disclosure.

FIG. 6 is a schematic diagram of a test channel selector 61 in accordance with an embodiment of the present disclosure. Table 4a is a logic table of test control signals and input/output signals of the test channel selector 61 of FIG. 6. Table 4b is a logic table of a control signal and input/output signals of the test channel selector 61 of FIG. 6. The test channel selector 61 may be used as one or more of the plurality of test channel selectors 106a, 106b, and the like in FIG. 2. The test channel selector 61 may or may not receive the test enable signal TEN that is indicative of the semiconductor device is in a test mode. In either case, the test channel selector 61 receives the set of the clock signal, the command signal and the write data queue signal that are affected by the test enable signal TEN. The test channel selector 61 may include a plurality of selectors 611, 612 and 613. For example, the plurality of selectors 611, 612 and 613 may be multiplexers that selectively couple one of input signals as an output signal based on a selection signal. A selector 611 receives a test clock signal TClkI from a test IO circuit, (e.g., the test terminal 101) and an mBIST clock signal mClkI from a BIST circuit (e.g., the BIST circuit 102) and further provides one of these received clock signals, if the test enable signal TEN is at a logic high level. A selector 612 receives a test command signal TComI from the test IO circuit and an mBIST command signal mCmdI from the BIST circuit and further provides one of these received command signals, if the test enable signal TEN is at the logic high level. Similarly, a selector 613 receives a test write data queue signal TWDqlI from the test IO circuit and an mBIST write data queue signal mWDqI from the BIST circuit and further provides one of these received write data queue signals, if the test enable signal TEN is at the logic high level. The plurality of selectors 611, 612 and 613 may keep a predetermined logic level (e.g., logic low), if the test enable signal TEN is also at the predetermined logic level (e.g., logic low).

TABLE 4a

A logic table of test control signals and input/output
signals of the test channel selector 61 of FIG. 6

|  | TEN = 0 | TEN = 1 & BSEL_Ch* = 0 | TEN = 1 & BSEL_Ch* = 1 |
|---|---|---|---|
| TclkO | 0 | TClk | mClk |
| TComO | 0 | TCom | mCom |
| TWDqO | 0 | TWDq | mWDq |
| mRDqO | TRDqI | TRDqI | TRDqI |

TABLE 4b

A logic table of a control signal and input/output
signals of the test channel selector 61 of FIG. 6

|  | RSEL = 0 | RSEL = 1 |
|---|---|---|
| TRDqO | Hi-Z | TRDqI |

The test channel selector may further include a buffer 614. When the test channel selector 61 receives a test read data queue signal TRDqI from the test bus selector (e.g., 107a, 107b), the buffer 614 may provide the received test read data queue signal TRDqI as a test read data queue output signal TRDqO to the test IO circuit when the RSEL signal is set to a logic high level. The buffer 614 alternatively sets the test read data queue output signal TRDqO at a floating state (Hi-Z) if the RSEL signal is set to a logic low level.

A node for receiving the test read data queue signal TRDqI from the test bus selector (e.g., 107a, 107b) may be coupled to a node for providing an mBIST read data queue output signal mRDqO. The test channel selector 61 receives a BSEL signal which is provided for each memory channel. The BSEL signal is a bus selection signal indicative of a target circuit (e.g., the test terminal 101, the BIST circuit 102, etc.) to be coupled to the respective memory channel. The test channel selector 61 provides the received BSEL signal to the plurality of selectors 611, 612 and 613. Each selector selects the clock signal, the command signal and the write data queue signal from one of the test IO circuit and the BIST circuit based on the received BSEL signal. The test channel selector 61 provides the clock signal, the command signal and the write data queue signal from the test IO circuit to the test bus selector when the test enable signal TEN is set to logic high and the BSEL signal is set to logic low. Alternatively, the test channel selector 61 provides the clock signal, the command signal and the write data queue signal generated by an algorithm pattern generator (APG) in the BIST circuit to the test bus selector when the test enable signal TEN is set to logic high and the BSEL signal is set to logic high.

TABLE 5

Figure 7:
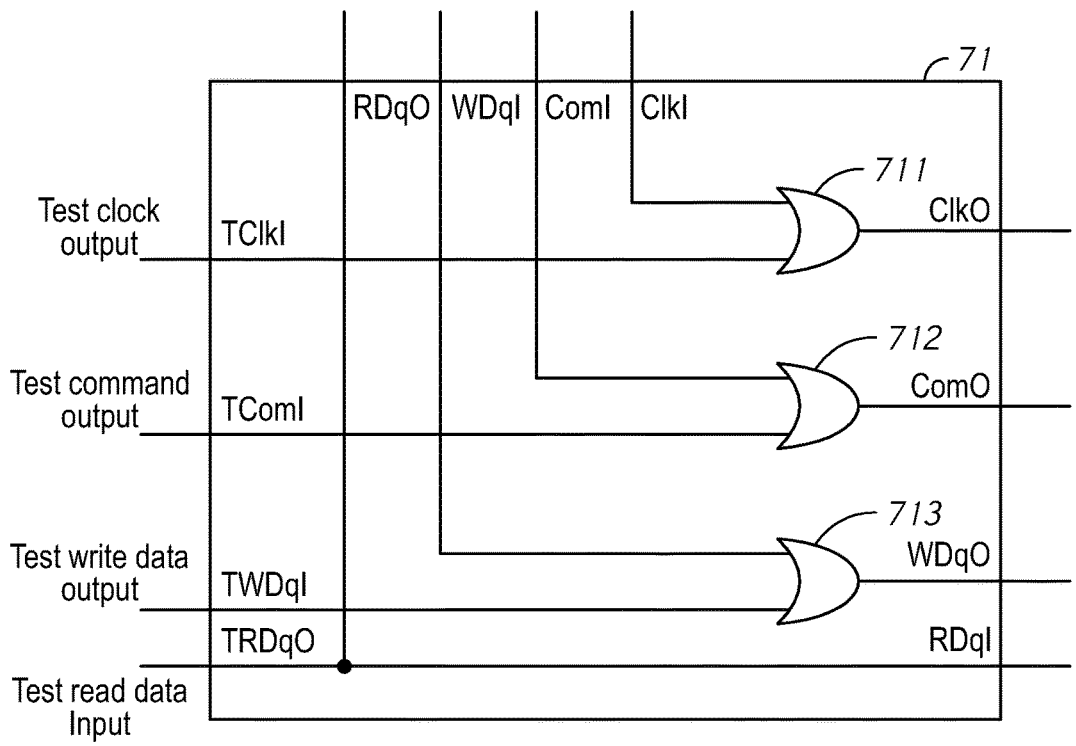
FIG. 7 is a schematic diagram of a test bus selector in the I/F die of FIG. 2 in accordance with an embodiment of the present disclosure.

A logic table of input/output signals
of the test bus selector 71 of FIG. 7

| Output | Input signals |
|---|---|
| ClkO | ClkI | TClkI |
| ComO | ComI | TComI |
| WDqO | WDqI | TWDqI |
| RDqO | RDqI |
| TRDqO | RDqI |

The I/F die 10 includes a plurality of test bus selectors 107a, 107b, . . . and the like. One test bus selector is provided for each channel. Each test bus selector (e.g., 107a, 107b) receives a set of a clock signal, a command signal and a write data queue signal from the respective test channel selector (e.g., 106a, 106b) and provide the received set of signals to a respective core die 11. Each test bus selector further provides a read data queue signal RDqI from the respective core die 11 to the respective test channel selector (e.g., 106a, 106b).

FIG. 7 is a schematic diagram of a test bus selector 71 in FIG. 2 in accordance with an embodiment of the present disclosure. Table 5 is a logic table of input/output signals of the test bus selector 71 of FIG. 7. The test bus selector 71 may be used as one or more of the plurality of test bus selectors 107a, 107b, and the like in FIG. 2 in order to select between signals from a respective native IO for a normal operation or from the respective test channel bus selector (e.g., test bus selectors 107a, 107b). For example, the bus selector 81 may include a plurality of OR circuits 711, 712 and 713. An OR circuit 711 receives a test clock signal TClkI from the respective test channel selector, (e.g., the test channel selectors 106a, 106b) and a clock signal ClkI from the respective terminal (e.g., a first terminal that is native IO 108a, a second terminal that is native IO 108b) and further provides one of these received clock signals as an output clock signal ClkO. If the test enable signal TEN is at the logic high level, the OR circuit 711 provides the test clock signal TClkI. The OR circuit 711 provides the clock signal ClkI, if the test enable signal TEN is at the logic low level. An OR circuit 712 receives a test command signal TComI from the respective test channel selector and a command signal ComI from the respective terminal and further provides one of these received command signals as an output command signal Com0. If the test enable signal TEN is at the logic high level, the OR circuit 712 provides the test command signal TComI. The OR circuit 712 provides the command signal CmdI, if the test enable signal TEN is at the logic low level. Similarly, an OR circuit 713 receives a test write data queue signal TWDqI from the respective test channel selector and a write data queue signal WDqI from the respective terminal and further provides one of these received write data queue signals as an output write data queue signal WDq0. If the test enable signal TEN is at the logic high level, the OR circuit 713 provides the test write data queue signal TWDqI. The OR circuit 713 alternatively provides the write data queue signal WDqI, if the test enable signal TEN is at the logic low level.

A node for receiving read data queue signal RDqI from a core die 11 may be coupled to a node for providing a read data queue output signal RDqO and further providing a test read data queue output signal TRDqO. Thus, a set of a clock signal, a command signal and a write data queue signal from either the terminal or the test channel selector is provided to a core die (e.g., the core die 11) and the read data queue signal from the core die may be provided to the terminal and the test channel selector.

TABLE 6

A logic table of relationships among source signals, control
signals of the test channel selector, and output signals
of the test bus selector to a core die in accordance with
an embodiment of the present disclosure

| Output\Control | TEN = 0 | TEN = 1 & BSEL_Ch* = 0 | TEN = 1 & BSEL_Ch* = 1 |
|---|---|---|---|
| Clk* | Native IO | TClk | mClk |
| Com* | Native IO | TCom | mCom |
| WDq* | Native IO | TWDq | mWDq |

Table 6 is a logic table of relationships among source signals, control signals of the test channel selector, and output signals of the test bus selector to a core die in accordance with an embodiment of the present disclosure. This logic table of Table 6 can be obtained from a combination of the logic table of Table 4a and the logic table of Table 5. When the test enable signal TEN is set to the logic low level, a source of signals is a terminal (e.g., native IO). When the test enable signal TEN is set to the logic high level, depending on the BSEL signal, the source of the signals may be either the test IO circuit or the BIST circuit.

Table 7 is a logic table of relationships between control signals and output signals of the I/F die of FIG. 2 in accordance with an embodiment of the present disclosure. When the test enable signal TEN is set to the logic low level, the I/F die is under a normal operation which is not in the test mode, thus a data queue of the terminal (e.g., native IO) is selected. When the test enable signal TEN is set to the logic high level, the I/F die is in the test mode. For each channel, the test IO circuit is selected as a source, if the BSEL signal is set to logic low and when the channel is selected by an RSEL signal. If the BSEL signal is set to logic high, the BIST circuit is selected as the source. Thus, by controlling BSEL signals and RSEL signals for each channel independently, an external tester and the BIST circuit may perform tests simultaneously for different channels, respectively. If the external tester and the BIST circuit are assigned to either an aggressor role or a victim role, it is possible to test noise interference between independent channels using different types of sequences (e.g., a read operation of one channel while an adjacent channel is executing a write operation, a write operation of the one channel while the adjacent channel is executing a refresh operation, and the like). Thus, a test by the BIST circuit and a test by an external tester can be performed simultaneously by merely small modification of one or more test channel selectors.

TABLE 7

A logic table of relationships between control signals and output signals of the I/F die of FIG. 2 in accordance with an embodiment of the present disclosure

|  | TEN = 0 | TEN = 1 & BSEL_Ch* = 0 | TEN = 1 & BSEL_Ch* = 1 |
|---|---|---|---|
| DQ of Native IO | Selected |  | Normal Operation |
| RDQ of Test IO Circuit |  | Selected (Channel selected by RSEL_Ch*) | Channel Selectable |
| Result of BIST circuit |  | Selected (Comparison result via SerialOut) | Channel Selectable |

A test for noise interference of channel-to-channel noise can be executed by assigning a noise generator role to one channel and a noise receiver role to another channel and have the one channel and the other channel tested by a combination of the BIST circuit and the tester respectively. Moreover, this embodiment can evaluate asynchronous noise between the channels assigned by the tester and BIST circuit because the tester and BIST circuit can use the respective clock signals independently from each other. For example, this embodiment can evaluate maximum noise between the channels by sweeping a timing of the clock signal supplied from the tester while maintaining a timing of the clock signal supplied from the BIST circuit.

In one embodiment, each channel in FIG. 2 may be set to an aggressor or a victim based on the BSEL signal. For example, when ch0 is set as an aggressor and ch1 to ch7 are set as victims, a test including a read operation to ch0 and write operations to ch1 to ch7 may be performed. The read operation to ch0 may be affected by one or more of the write operations to ch1 to ch7. This type of tests may reveal noise interference on a selected one channel under several noise conditions when the semiconductor device in FIG. 2 is implemented as High Bandwidth Memory (HBM). In another embodiment, ch0 may be selected as an aggressor, and one of the other channels (e.g., ch1) may be selected as a victim. The unselected channels (e.g., ch2 to ch7) may be deactivated into a non-operation state. In order to perform a test evaluating noise interference between selected two channels as suggested the above, one or more logics for enabling or disabling each channel individually may additionally be implemented.

In one embodiment, an HBM package may include terminals (e.g., native IOs), which may also be operated simultaneously, in addition to a BIST circuit and a tester in the test mode. In this embodiment, more combinations of a tester, a BIST circuit and a terminal may be provided to each channel. For example, the BIST circuit and the terminal may be operated simultaneously.

Figure 8:
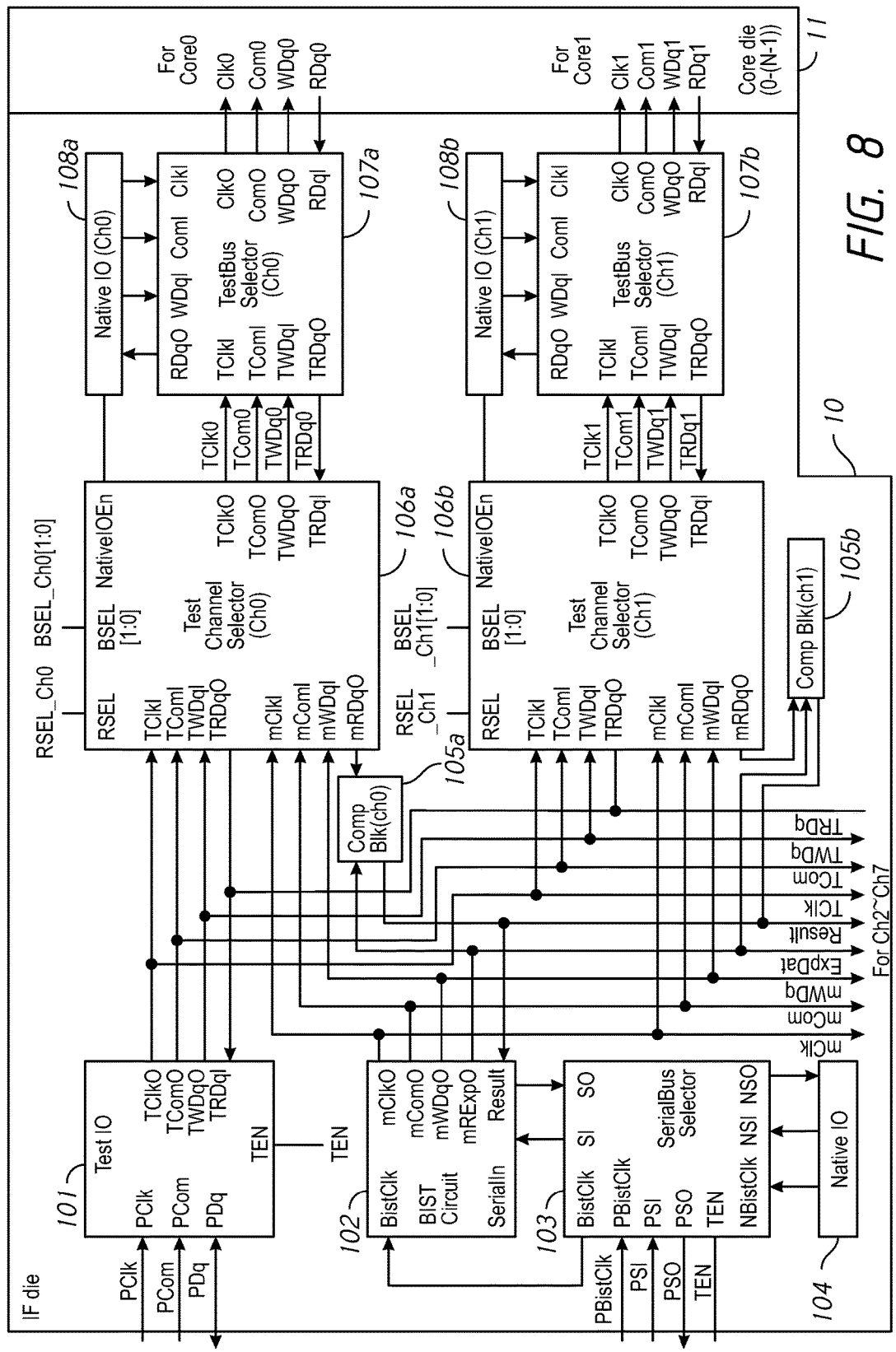
FIG. 8 is a block diagram of an interface (I/F) die including a test input/output (IO) circuit for a probe test and a Memory Built-In Self Test (mBIST) circuit in a semiconductor device in accordance with an embodiment of the present disclosure.

FIG. 8 is a block diagram of an interface (I/F) die including a test input/output (IO) circuit for a probe test and a Memory Built-In Self Test (mBIST) circuit in a semiconductor device in accordance with an embodiment of the present disclosure. Description of components corresponding to components included in and previously described with reference to FIG. 2 will not be repeated. As shown in FIG. 8, each test channel selector (e.g., test channel selectors 106a and 106b) may receive a two-bit BSEL signal. Furthermore, each test channel selector (e.g., test channel selectors 106a and 106b) may be coupled to a respective terminal (e.g., a first terminal which is a native IO 108a, a second terminal which is a native IO 108b) for providing a NativeIOEn signal used to activate the respective native IO. The test channel selectors (e.g., test channel selectors 106a and 106b) are thus designed to switch among signals from a test terminal 101, signals from a BIST circuit 102, and signals from the respective terminal.

Figure 9:
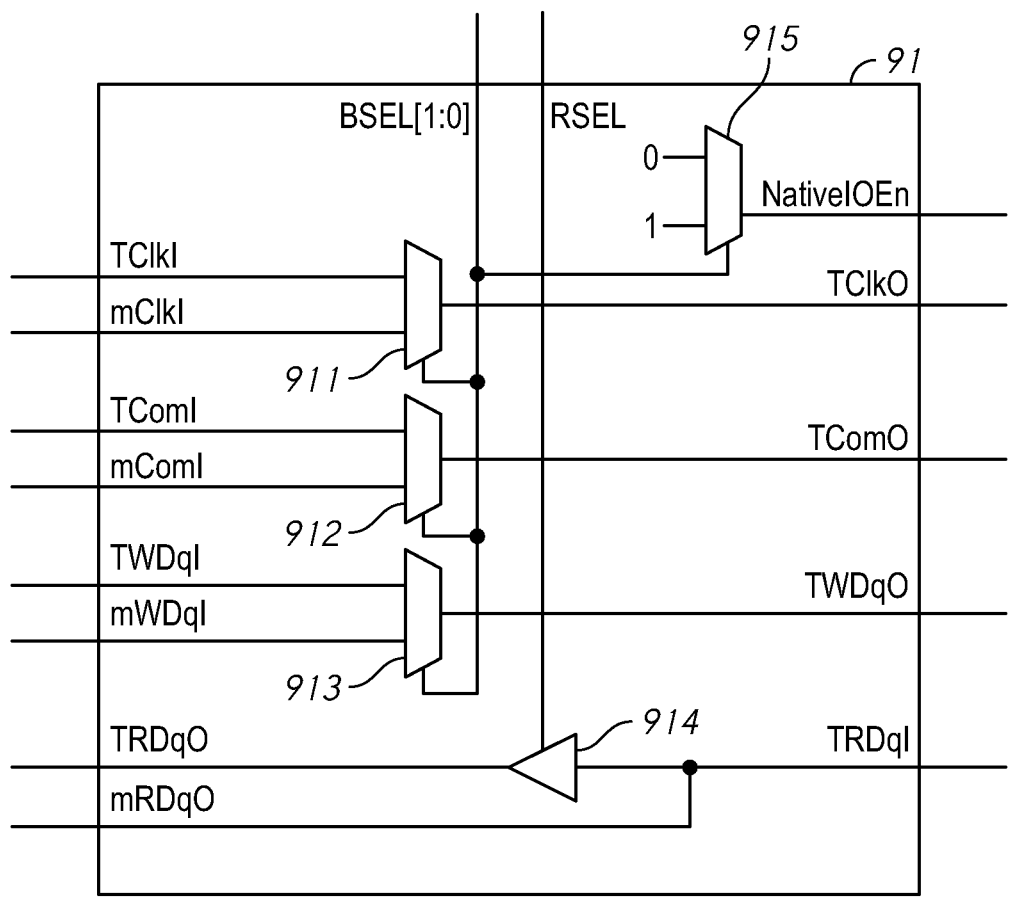
FIG. 9 is a schematic diagram of a test channel selector in the I/F die of FIG. 8 in accordance with an embodiment of the present disclosure.

FIG. 9 is a schematic diagram of a test channel selector 91 in accordance with an embodiment of the present disclosure. Table 8a is a logic table of test control signals and input/output signals of the test channel selector 91 of FIG. 9. Table 8b is a logic table of a control signal and input/output signals of the test channel selector 91 of FIG. 9. The test channel selector 91 may be used as one or more of the plurality of test channel selectors 106a, 106b, and the like in FIG. 8. The test channel selector 91 may or may not receive the test enable signal TEN that is indicative of the semiconductor device is in a test mode. In either case, the test channel selector 91 receives the set of the clock signal, the command signal and the write data queue signal, which are responsive to the test enable signal TEN.

TABLE 8a

A logic table of test control signals and input/output signals of the test channel selector 91 of FIG. 9

|  | TEN = 0 \| BSEL_Ch* = 00/11 | TEN = 1 & BSEL_Ch* = 01 | TEN = 1 & BSEL_Ch* = 11 |
|---|---|---|---|
| TclkO | 0 | TClk | mClk |
| TComO | 0 | TCom | mCom |

TABLE 8a-continued

A logic table of test control signals and input/output
signals of the test channel selector 91 of FIG. 9

|  | TEN = 0 \| <br> BSEL_Ch* = 00/11 | TEN = 1 & <br> BSEL_Ch* = 01 | TEN = 1 & <br> BSEL_Ch* = 11 |
|---|---|---|---|
| TWDqO | 0 | TWDq | mWDq |
| mRDqO | TRDqI | TRDqI | TRDqI |

The test channel selector 91 may include a plurality of selectors 911, 912 and 913. For example, the plurality of selectors 911, 912 and 913 may be multiplexers that selectively couple one of input signals as an output signal based on a selection signal. A selector 911 receives a test clock signal TClkI from a test IO circuit, (e.g., the test terminal 101) and an mBIST clock signal mClkI from a BIST circuit (e.g., the BIST circuit 102) and further provides one of these received clock signals, if the test enable signal TEN is at a logic high level. A selector 912 receives a test command signal TComI from the test IO circuit and an mBIST command signal mCmdI from the BIST circuit and further provides one of these received command signals, if the test enable signal TEN is at the logic high level. Similarly, a selector 913 receives a test write data queue signal TWDqI from the test IO circuit and an mBIST write data queue signal mWDqI from the BIST circuit and further provides one of these received write data queue signals, if the test enable signal TEN is at the logic high level. The plurality of selectors 911, 912 and 913 may keep a predetermined logic level (e.g., logic low), if the test enable signal TEN is also at the predetermined logic level (e.g., logic low).

The test channel selector may further include a buffer 914. When the test channel selector 91 receives a test read data queue signal TRDqI from the test bus selector (e.g., 107a, 107b), the buffer 914 may provide the received test read data queue signal TRDqI as a test read data queue output signal TRDqO to the test IO circuit when the RSEL signal is set to a logic high level. The buffer 914 alternatively sets the test read data queue output signal TRDqO at a floating state (Hi-Z) if the RSEL signal is set to a logic low level.

TABLE 8b logic table of a control signal and input/output
signals of the test channel selector 91 of FIG. 9

|  | RSEL = 0 | RSEL = 1 |
|---|---|---|
| TRDqO | Hi-Z | TRDqI |

TABLE 8c

A logic table of test control signals and input/output
signals of the test channel selector 91 of FIG. 9

| BSEL[1:0] | T*O | NativeIOEn |
|---|---|---|
| 00 | 0 | 1 (native IO enable) |
| 01 | T*I | 0 (native IO disable) |
| 10 | m*I | 0 (native IO disable) |
| 11 | 0 | 1 (native IO enable) |

A node for receiving the test read data queue signal TRDqI from the test bus selector (e.g., 107a, 107b) may be coupled to a node for providing an mBIST read data queue output signal mRDqO. The test channel selector 91 may further include a selector 915 that may provide a NativeIOEn signal of either logic low or logic high for enabling or disabling the respective terminal. Table 8c is a logic table of a control signal and input/output signals of the test channel selector 91 of FIG. 9. The test channel selector 91 may receive a two-bit BSEL signal [1:0] and provide the two-bit BSEL signal [1:0] to the plurality of selectors 911, 912, 913 and 915. Each of the plurality of selectors 911, 912 and 913 selects the clock signal, the command signal and the write data queue signal from one of the test IO circuit and the BIST circuit based on the BSEL signal. In this example shown in Tables 8a and 8c, the selector 915 provides the NativeIOEn signal set to logic high indicative of enabling the terminal when the test enable signal TEN is set to logic low or both bits of the BSEL [0:1] is set to either logic high (="11") or logic low (="00"). Alternatively, the selector 915 provides the NativeIOEn signal set to logic low indicative of disabling the terminal when one bit of the BSEL [0:1] is set to logic high and the other bit of the BSEL [0:1] is set to logic low (e.g., "01" or "10") while the test enable signal TEN is set to logic high. Furthermore, the test channel selector 91 provides a set of the clock signal, the command signal and the write data queue signal from the test IO circuit to the test bus selector, responsive to a combination of the test enable signal TEN being logic high and the BSEL signal [1:0] being "01". Alternatively, the test channel selector 91 provides a set of the clock signal, the command signal and the write data queue signal generated by an algorithm pattern generator (APG) in the BIST circuit to the test bus selector, when the test enable signal TEN is set to logic high and the BSEL [1:0] signal is set to "10".

On the I/F die, one of the test IO circuit, the BIST circuit and the terminal (e.g., native IO) is assigned a role of an aggressor and another one of the test IO circuit, the BIST circuit and the terminal is assigned a role of a victim. Thus, a test may be performed for a combination of the aggressor and the victim. This configuration allows performing evaluation of an access sequence related to the combination of the aggressor and the victim independently, whether a specified channel correctly performs operations (e.g. a read operation or a write operation) under noise generated from another channel performing a write operation or a refresh operation simultaneously. By controlling the BSEL signal, it is possible to choose a combination of test signals, such as a combination of the terminal and the BIST circuit, a combination of the test IO circuit and the terminal, or a combination of the BIST circuit and the test IO circuit. Table 9 is a logic table of relationships among source signals, control signals of the test channel selector, and output signals of the test bus selector to a core die in accordance with an embodiment of the present disclosure. When the test enable signal TEN is set to logic low or both bits of the BSEL [0:1] is set to either logic high (="11") or logic low (="00"), the NativeIOEn signal is set to logic high and the terminal (e.g., native IO) is enabled.

TABLE 9

A logic table of relationships among source signals, control
signals of the test channel selector, and output signals
of the test bus selector to a core die in accordance with
an embodiment of the present disclosure

| Output\ Control | TEN = 0 \| <br> BSEL_Ch* = 00/11 | TEN = 1 & <br> BSEL_Ch* = 01 | TEN = 1 & <br> BSEL_Ch* = 10 |
|---|---|---|---|
| Clk* | Native IO | TClk | mClk |
| Com* | Native IO | TCom | mCom |
| WDq* | Native IO | TWDq | mWDq |

The NativeIOEn signal is set to logic low indicative of disabling the terminal when one bit of the BSEL [0:1] is set to logic high and the other bit of the BSEL [0:1] is set to logic low (e.g., "01" or "10") while the test enable signal TEN is set to logic high. Table 10 is a logic table of relationships between control signals and output signals of the I/F die of FIG. 8 in accordance with an embodiment of the present disclosure. Furthermore, the test channel selector 91 provides a set of the clock signal, the command signal and the write data queue signal from the test IO circuit to the test bus selector, responsive to a combination of the test enable signal TEN being logic high and the BSEL signal [1:0] being "01". Alternatively, the test channel selector 91 provides a set of the clock signal, the command signal and the write data queue signal generated by an algorithm pattern generator (APG) in the BIST circuit to the test bus selector, when the test enable signal TEN is set to logic high and the BSEL [1:0] signal is set to "10". Thus, the I/F die allows to perform more detailed noise evaluation by controlling aggressor and victim roles for different test channels.

TABLE 10

A logic table of relationships between control signals and output signals of the I/F die of FIG. 8 in accordance with an embodiment of the present disclosure.

|  | TEN = 0\| BSEL_Ch* = 00/11 | TEN = 1 & BSEL_Ch* = 01 | TEN = 1 & BSEL_Ch* = 10 |
|---|---|---|---|
| DQ of Native IO | Selected |  | Normal Operation |
| RDQ of Test IO Circuit |  | Selected (Channel selected by RSEL_Ch*) | Channel Selectable |
| Result of BIST circuit |  | Selected (Comparison result via SerialOut) | Channel Selectable |

Figure 10:
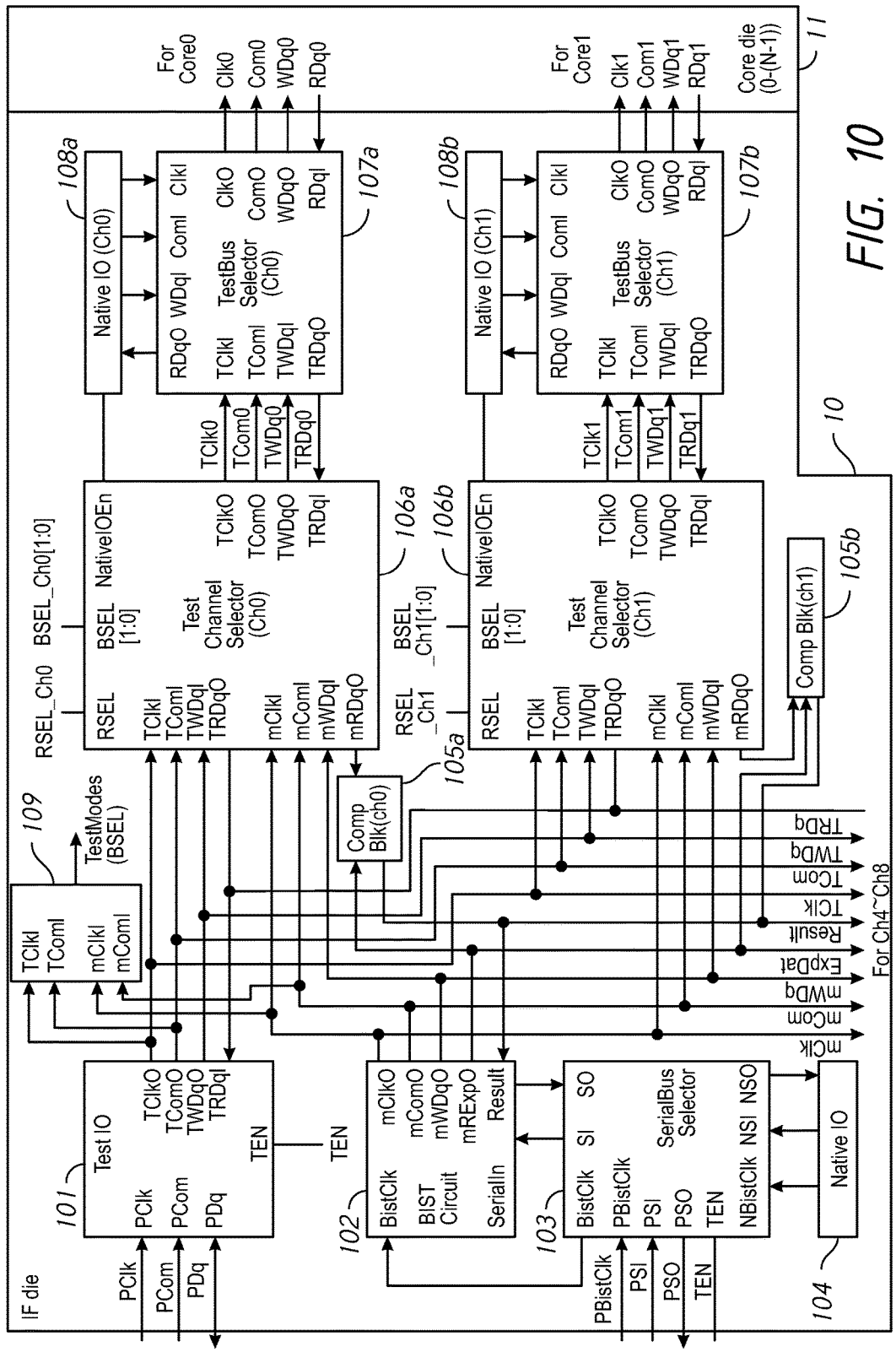
FIG. 10 is a block diagram of an interface (I/F) die including a test input/output (IO) circuit for a probe test, a Memory Built-In Self Test (mBIST) circuit, and a test mode entry circuit in a semiconductor device in accordance with an embodiment of the present disclosure.

In one embodiment, one or more test modes may be provided in a test mode entry circuit. FIG. 10 is a block diagram of an interface (I/F) die including a test input/output (IO) circuit for a probe test, a Memory Built-In Self Test (mBIST) circuit, and a test mode entry circuit 109 which functions as a test mode selector in a semiconductor device in accordance with an embodiment of the present disclosure. Description of components corresponding to components included in FIG. 8 will not be repeated. As shown in FIG. 10, the test mode entry circuit 109 may receive a combination of a clock signal and a command signal from the test terminal 101 and the BIST circuit 102 and provides a BSEL signal.

Figure 11:
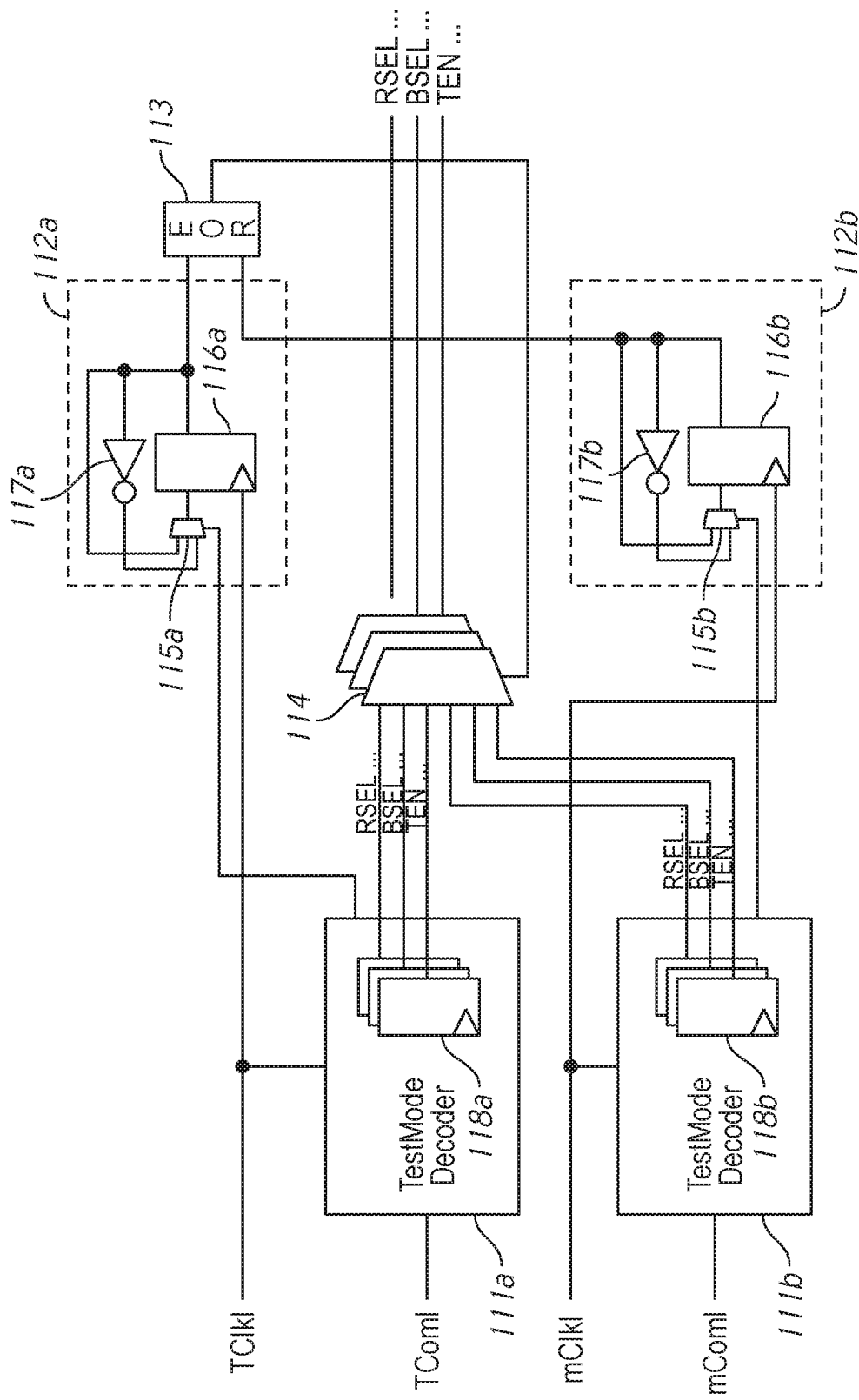
FIG. 11 is a schematic diagram of a test mode entry circuit in the I/F die of FIG. 10 in accordance with an embodiment of the present disclosure.

FIG. 11 is a schematic diagram of a test mode entry circuit 110 in FIG. 10 in accordance with an embodiment of the present disclosure. The test mode entry circuit 110 may be used as the test mode entry circuit 109 in FIG. 10. For example, the test mode entry circuit 110 may include test mode decoders 111a and 111b that receive command signals including test mode information and decode the commands to extract test modes. For example, the test mode decoder 111a receives and decodes a test command signal from a test IO circuit (e.g., the test terminal 101 in FIG. 10) and provides a test mode based on the decoded command signal of the test IO circuit. Similarly, the test mode decoder 111b receives and decodes an mBIST command signal from a BIST circuit (e.g., BIST circuit 102 in FIG. 10) and provides a test mode based on the decoded command signal of the BIST circuit. Test mode priority circuits 112a and 112b receive the decoded command signals from the test mode decoders 111a and 111b respectively and provide test mode signals. The test mode priority circuits 112a and 112b may be toggle registers. For example, the test mode priority circuit 112a may include a flip flop circuit (FF) 116a and a selector 115a. The selector 115a can select an output signal of the flip flop circuit 116a with or without an inverter 117a. For example, the selector 115a selects an output signal of the inverter 117a when the test mode decoder 111a provides the test mode to the selector 115a. In this case, the FF 116a provides an inverted signal of the output signal of the FF 116a based on the signal TClkI. The output signal of the FF 116a is provided to the selector 115a via or without the inverter 117a. The output signal of the FF 116a is provided to an exclusive-OR (EOR) circuit 113 for priority control. The test mode priority circuit 112b has a similar circuit structure with the test mode priority circuit 112a, except that the selector 115b receives the test mode from the test mode decoder 111b and the FF 116b is operated by the clock mClkI. For example, the selector 115b selects an output signal of the inverter 117b when the test mode decoder 111b provides the test mode to the selector 115b. The output signal of the inverter 117 is provided to the EOR circuit 113 for priority control.

An output signal from the EOR circuit 113 controls selectors 114 which provides test signals such as test enable signal TEN, control signals BSEL, RSEL, etc. In an initial stage, the FFs 116a and 116b provide a logic low level respectively by a reset signal or like, such that the EOR circuit 113 provides the logic low level and the selectors 114 select the signals RSEL, BSE, TEN from the test mode decoder 111a. That is, in the initial stage, the selectors 114 select and provide the signals TComI from the tester. In this status, the BIST circuit 102 obtains priority control, by issuing a test mode command as mComI and the test mode decoder 111b detects its command and provides the test mode. The selector 115b selects the output signal of the inverter 117b, that is, a logic high level responsive to the test mode. Then the FF 116b provides the logic high level responsive to the clock signal mClkI and the EOR circuit 113 provides the logic high level. As a result, the selectors 114 select the signals RSEL, BSE, TEN from the test mode decoder 111b from the BIST circuit 102. The test mode decoders 111a and 111b may include latch circuits 118a and latch circuits 118b respectively, each of which can latch a decoded signal of the test mode commands TComI and mComI respectively in response to the respective clock signal TClkI and mClkI. The BIST circuit 102 can obtain a priority control even if the tester on a TCom side is not coupled to the semiconductor device of the embodiment (e.g., the test pad is not connected to the tester).

When the BIST circuit 102 completes a test, the tester can issue the test command TComI to execute a test operation from the tester. Responsive to the test command TComI, the selector 115a receives the output signal of the inverter 117a which is logic high, and the FF 116a provides the logic high level. As a result, the EOR circuit 113 provides the logic low level such that the selectors 114 select the signals RSEL, BSE, TEN from the test mode decoder 111a. Accordingly, the priority control can be switched from the BIST control to the tester.

The embodiment described above showed a test mode entry circuit after stages of the test IO circuit and the BIST circuit on the I/F die as an example. However, the test mode entry circuit may be provided anywhere on the I/F die (e.g., inside test I/O circuit, inside the BIST circuit) or outside of the I/F die (e.g. inside the probe, inside the tester, etc.).

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising an interface chip that is configured to interface with a plurality of dice through at least first and second memory channels, each of the plurality of dice comprising a plurality of memory cells, and the interface chip comprising:
   a test circuit, wherein the test circuit comprises:
      first and second terminals, each of the first and second terminals corresponding to the first and second memory channels;
      a test terminal provided in common to the first and second memory channels, and the test terminal configured to be coupled to a tester by a probe;
      a built in self test (BIST) circuit provided in common to the first and second memory channels; and
      a selector coupled to the first and second terminals, the test terminal and the BIST circuit, and configured to couple a first selected one of the first terminal, the test terminal and the BIST circuit to the first memory channel and a second selected one of the second terminal, the test terminal and the BIST circuit to the second memory channel, the first selected one being different from the second selected one, wherein the selector is a test channel selector configured to receive a first set of signals from the test terminal and further configured to receive a second set of signals from the BIST circuit, and configured to select either the first set or the second set responsive to at least one control signal; and
   a test bus selector coupled to either the first memory channel or the second memory channel, configured to receive either the selected first set of signals or second set of signals from the test channel selector or a third signal set from the coupled one of the first terminal or the second terminal, and further configured to provide the received signal set to one of the first memory channel and the second memory channel respective to the coupled one of the first terminal and the second terminal.

2. The apparatus as claimed in claim 1, wherein the first selected one is one of the test terminal and the BIST circuit and the second selected one is one of the test terminal and the BIST circuit that is different from the first selected one.

3. The apparatus as claimed in claim 1, wherein the first selected one is the first terminal and the second selected one is either one of the test terminal and the BIST circuit.

4. The apparatus of claim 1, wherein the selector is a test bus selector coupled to the first memory channel, configured to receive either a test signal from a set of signals or another signal set from the coupled one of the first terminal or the second terminal, and further configured to provide the received signal set to the first memory channel respective to the coupled one of the first terminal and the second terminal.

5. The apparatus of claim 1, wherein the test channel selector is coupled to a test mode selector that is configured to provide a control signal of the at least one control signal.

6. The apparatus of claim 1, wherein the test channel selector is coupled to a test mode selector that is configured to provide a control signal of the at least one control signal, the control signal of the at least one control signal comprises at least two bits to provide selection among the test terminal, the BIST circuit and the coupled one of the first terminal and the second terminal.

* * * * *